United States Patent

Huang

(10) Patent No.: US 6,729,896 B2
(45) Date of Patent: May 4, 2004

(54) ELECTRICAL CONNECTOR WITH DISTORTION-RESISTANT COVER

(75) Inventor: Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/290,024

(22) Filed: Nov. 6, 2002

(65) Prior Publication Data

US 2003/0220007 A1 Nov. 27, 2003

(30) Foreign Application Priority Data

May 24, 2002 (TW) ...................................... 91207528 U

(51) Int. Cl.⁷ ............................................ H01R 13/625
(52) U.S. Cl. ....................................................... 439/342
(58) Field of Search ................................. 439/342, 266, 439/267

(56) References Cited

U.S. PATENT DOCUMENTS

| | | | | |
|---|---|---|---|---|
| 5,588,861 A | * | 12/1996 | Townsend | 439/342 |
| 5,597,318 A | * | 1/1997 | Townsend | 439/342 |
| 5,611,705 A | * | 3/1997 | Pfaff | 439/266 |
| 5,807,127 A | * | 9/1998 | Ohshima | 439/266 |
| 6,413,110 B2 | * | 7/2002 | Keller | 439/342 |

* cited by examiner

Primary Examiner—Tulsidas C. Patel
(74) Attorney, Agent, or Firm—Wei Te Chung

(57) ABSTRACT

An electrical connector (3) for electrically connecting a CPU with a PCB (4). The connector includes an insulative body (1). The body includes a base (11), and a cover (12) slidably mounted on the base. The cover defines a multiplicity of through holes (122) in a main plate (121) thereof. Each through hole includes a guiding opening (1221) at a top surface (1211) of the main plate, and a cylindrical receiving portion (1222) at a bottom surface (1212) of the main plate. The receiving portion is below and in communication with the guiding opening. A multiplicity of recesses (124) is defined in the bottom surface, respectively between adjacent through holes. Accordingly, a thickness of the main plate between adjacent through holes is substantially the same from the top surface to the bottom surface. Any expansion of the main plate during installation, use or operation of the connector is substantially uniform.

14 Claims, 5 Drawing Sheets

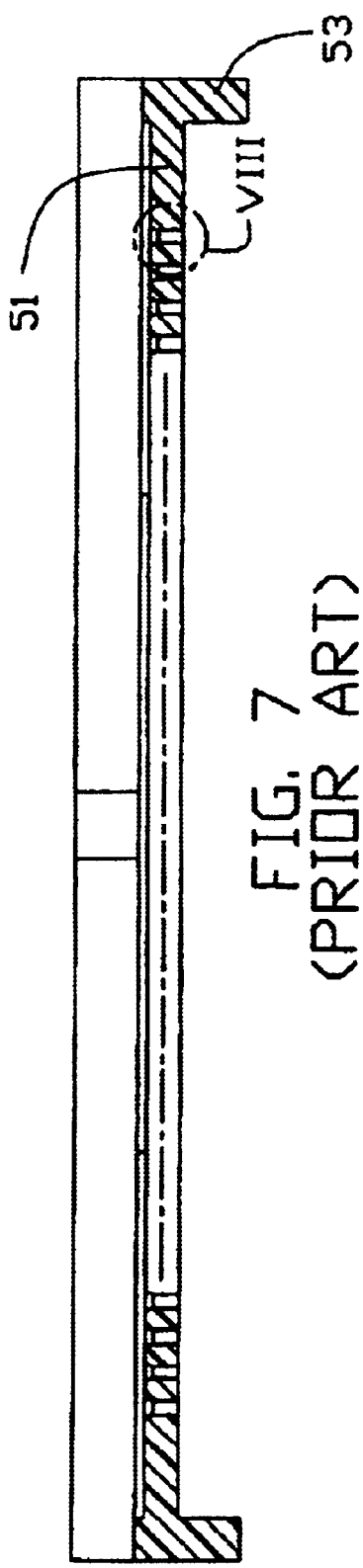
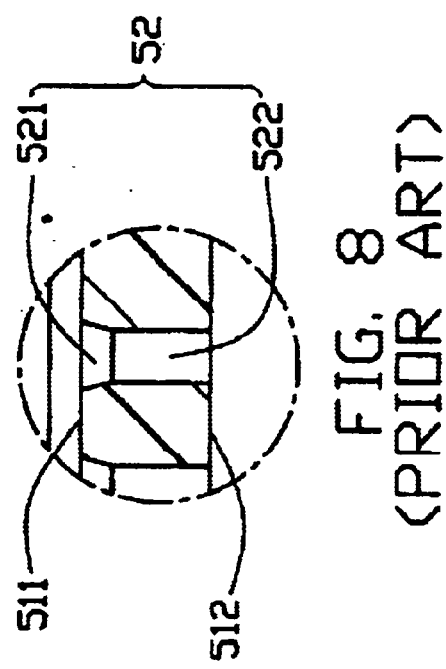
FIG. 7 (PRIOR ART)
FIG. 8 (PRIOR ART)

US 6,729,896 B2

ELECTRICAL CONNECTOR WITH DISTORTION-RESISTANT COVER

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to an electrical connector with a cover configured to minimize any distortion thereof.

2. Description of Prior Art

CPU sockets are widely used in personal computer (PC) systems to electrically connect CPUs with PCBs. A typical CPU socket comprises a base, and a cover slidably engaged on the base. The cover drives pins of the CPU into electrical engagement with electrical contacts received in the base.

A conventional CPU socket with a slidable cover is disclosed in "Development of a ZIF BGA Socket" (May 2000, P16~18, Connector Specifier Magazine). Similar structures are also disclosed in U.S. Pat. Nos. 4,988,310, 6,375,485, 6,315,592, 6,250,941, and 6,186,815.

Referring to FIGS. 7 and 8, a cover of a conventional CPU socket comprises a main plate 51, and two side plates 53 depending from opposite sides of the main plate 51 respectively. A multiplicity of holes 52 is defined through the main plate 51. The holes 52 are arranged in a rectangular array. Each hole 52 comprises a guiding opening 521 at a top surface 511 of the main plate 51, to facilitate insertion of a corresponding pin of the CPU into the hole 52. Each hole 52 further comprises a receiving portion 522 at a bottom surface 512 of the main plate 51, for receiving the corresponding pin of the CPU. The receiving portion 522 is below and in communication with the guiding opening 521.

As a result of the configurations of the guiding openings 521 and the receiving portions 522, a span of the main plate 51 between adjacent holes 52 varies from the top surface 511 to the bottom surface 512.

During soldering of the CPU socket to the PCB, the CPU socket is heated to establish electrical connection with the PCB. The main plate 51 expands. Because the said span of the main plate 51 varies, the main plate 51 transversely expands in a non-uniform manner. Thus the top surface 511 and the bottom surface 512 are prone to distort. The cover is prone to warp and distort relative to a base of the CPU socket during such soldering.

When the cover is not parallel to the base, this can adversely affect the reliability of electrical transmission through the CPU socket. It can even result in failure of electrical connection between the CPU socket and the CPU, due to faulty insertion of the pins of the CPU into the CPU socket.

A new electrical connector that overcomes the above-mentioned disadvantages is desired.

SUMMARY OF THE INVENTION

Accordingly, an object of the present invention is to provide an electrical connector for electrically connecting an electronic package such as a CPU with a circuit substrate such as a PCB, the electrical connector having a distortion-resistant cover configured to minimize any distortion thereof during installation, use or operation of the electrical connector.

To achieve the above-mentioned object, an electrical connector for electrically connecting a CPU with a PCB is provided by the present invention. In a preferred embodiment, the electrical connector comprises an insulative body, and a multiplicity of conductive terminals received in the body. The body comprises a base fixed to the PCB, and a cover slidably mounted on the base.

The cover comprises a main plate, and two side plates depending from opposite sides of the main plate respectively. A multiplicity of through holes is defined in the main plate. The through holes are arranged in a rectangular array. Each through hole comprises a funneled guiding opening at a top surface of the main plate, and a cylindrical receiving portion at a bottom surface of the main plate. The receiving portion is below and in communication with the guiding opening. A multiplicity of recesses is defined in the bottom surface of the main plate, respectively between a multiplicity of adjacent through holes.

Accordingly, a span of the main plate between adjacent through holes is substantially the same from the top surface to the bottom surface. Any transverse expansion or contraction of the main plate during installation, use or operation of the electrical, connector is substantially uniform.

Other objects, advantages and novel features of the invention will become more apparent from the following detailed description when taken in conjunction with the accompanying drawings, in which:

BRIEF DESCRIPTION OF THE DRAWINGS

FIG. 7 a simplified cross-sectional view of a conventional electrical connector cover; and FIG. 8 is an enlarged view of a circled portion VIII of FIG. 7.

DETAILED DESCRIPTION OF PREFERRED EMBODIMENT OF THE INVENTION

Reference will now be made to the drawings to describe the present invention in detail.

Figure 1:
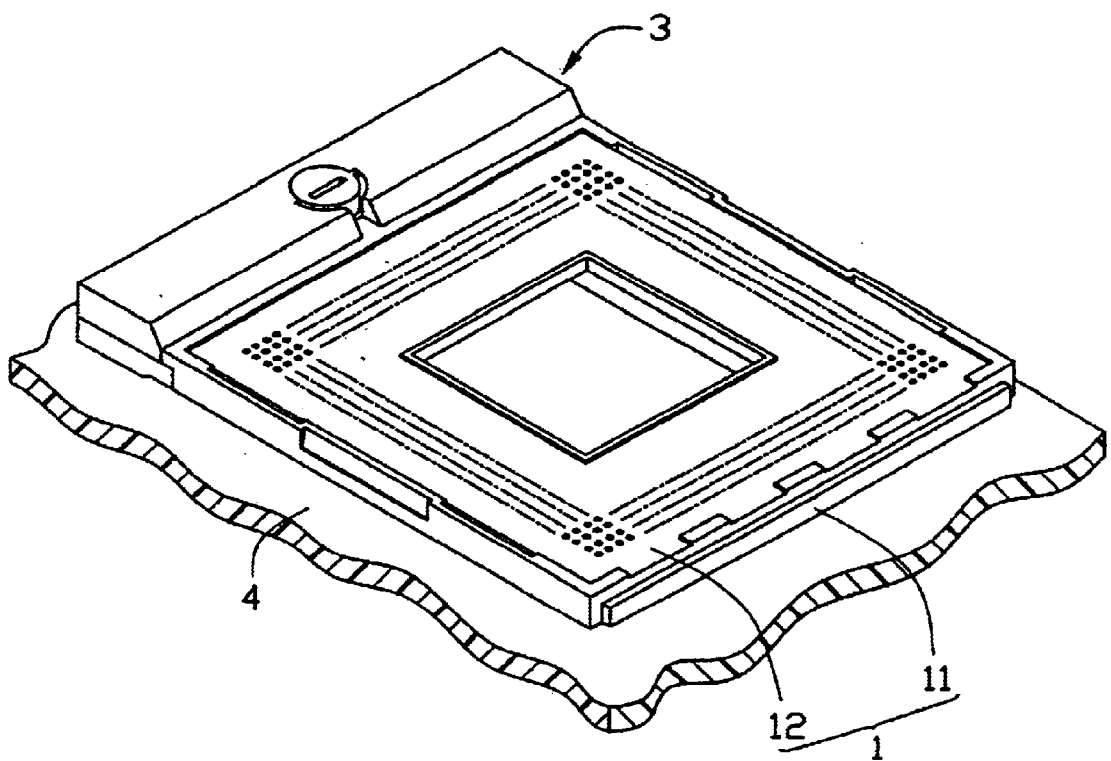
FIG. 1 is a simplified isometric view of an electrical connector in accordance with the present invention, showing the electrical connector mounted on a PCB.

Referring to FIG. 1, an electrical connector 3 in accordance with a preferred embodiment of the present invention for electrically connecting a central processing unit (CPU) (not shown) to a printed circuit board (PCB) 4 comprises an insulative body 1, and a multiplicity of conductive terminals (not shown) received in the body 1. The body 1 comprises a base 11 fixed to the PCB 4, and a cover 12 slidably mounted on the base 11. The terminals are received in the base 11.

Figure 2:
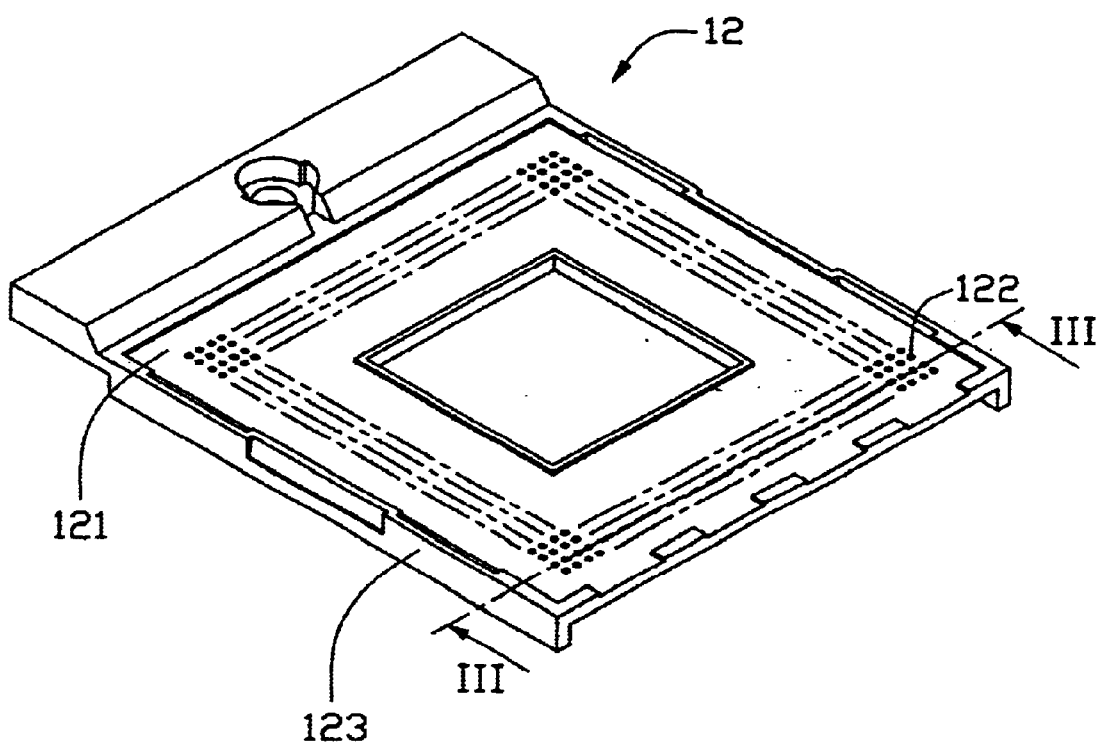
FIG. 2 is a simplified isometric view of a cover of the electrical connector of FIG. 1.
Figure 3:
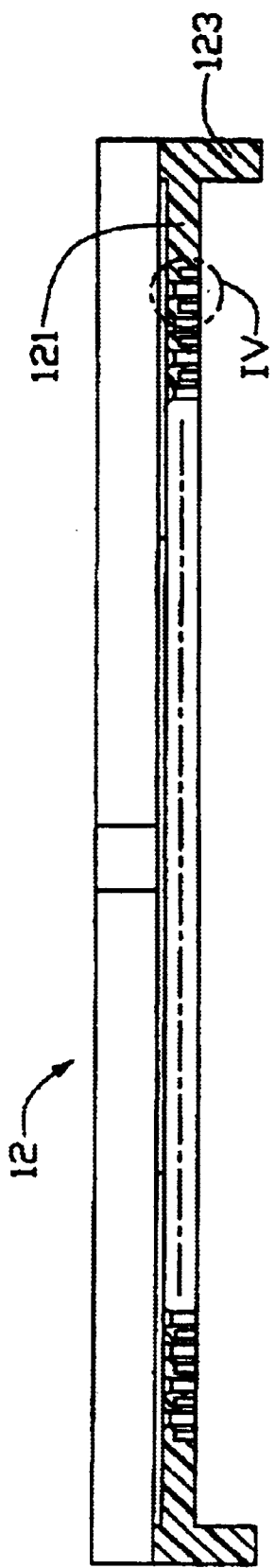
FIG. 3 is a cross-sectional view taken along line 111—111 of FIG. 2.
Figure 4:
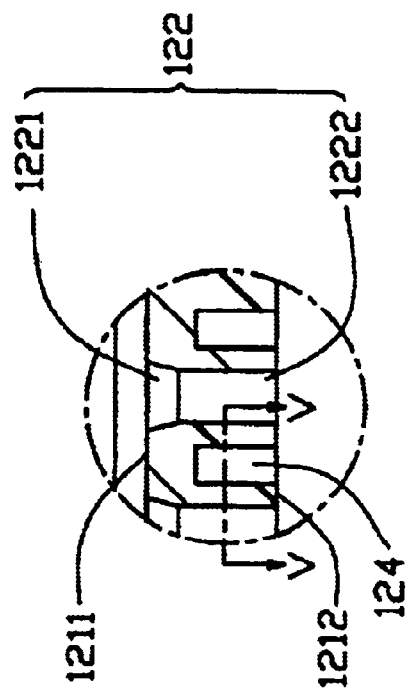
FIG. 4 is an enlarged view of a circled portion IV of FIG. 3.

Referring to FIGS. 2, 3 and 4, the cover 12 comprises a main plate 121, and two side plates 123 depending from opposite sides of the main plate 121 respectively. A multiplicity of through holes 122 is defined in the main plate 121. The through holes 122 are arranged in a rectangular array.

Each through hole 122 comprises a guiding opening 1221 at a top surface 1211 of the main plate 121, to facilitate insertion of a corresponding pin (not shown) of the CPU into the through hole 122. Each through hole 122 further comprises a receiving portion 1222 at a bottom surface 1212 of the main plate 121, for receiving the corresponding pin of the CPU. The receiving portion 1222 is below and in communication with the guiding opening 1221.

As a result of the configurations of the guiding openings 1221 and the receiving portions 1222, span of the main plate 121 between adjacent through holes 122 varies from the top surface 1211 to the bottom surface 1212.

Figure 5:
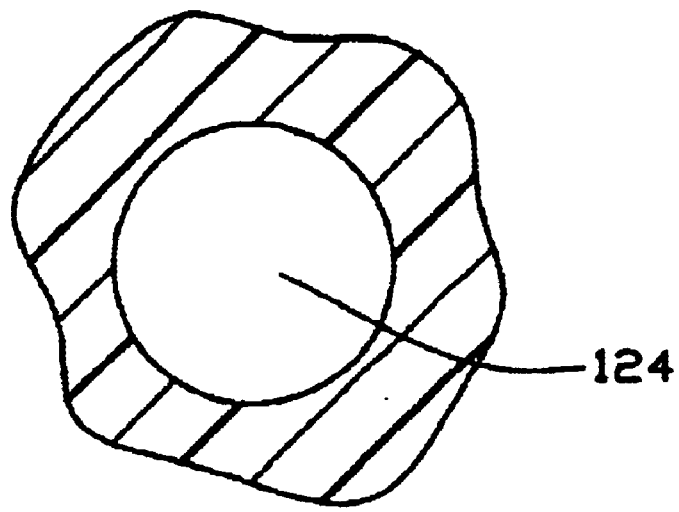
FIG. 5 is an enlarged cross-sectional view of V—V of FIG. 4, showing one recess has a generally circular cross-section.
Figure 6:
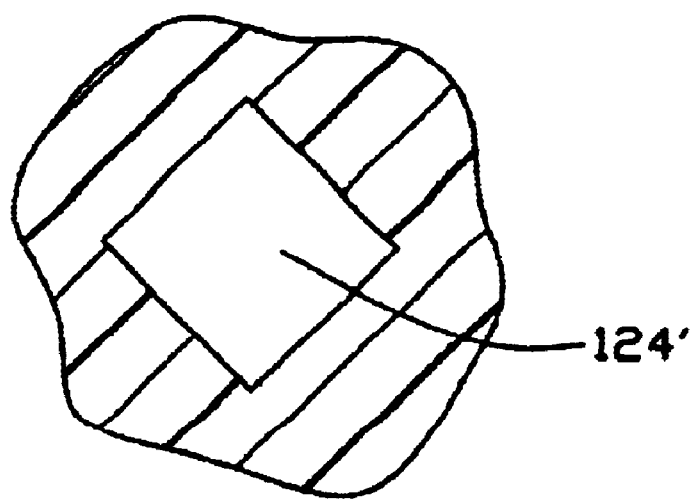
FIG. 6 is similar to FIG. 5, but showing the recess has an alternatively rhombic cross-section.

In addition, however, a multiplicity of recesses 124 is defined in the bottom surface 1212 of the main plate 121, respectively between a multiplicity of adjacent through holes 122. A height of the recesses 124 corresponds to a height of the receiving portions 1222. The recesses 124 may have a variety of different shapes. For example, the recess may has a circular cross-section (shown in FIG. 5). Alternatively recess 124' as shown in FIG. 6 has a rhombic cross-section. In the preferred embodiment, the recess 124 has a circular cross-section. As a result of the configuration of the recesses 124, a span of the main plate 121 between adjacent receiving portions 1222 is reduced.

Accordingly, the span of the main plate 121 between adjacent through holes 122 is substantially the same from the top surface 1211 to the bottom surface 1212. Any transverse expansion or contraction of the main plate 121 during installation, use or operation of the electrical connector 3 is substantially uniform. Any distortion of the top surface 1211 or the bottom surface 1212 is minimized. This ensures that the cover 12 remains parallel to the base 11, and enhances reliability of signal transmission of the electrical connector 3.

While a preferred embodiment in accordance with the present invention has been shown and described, equivalent modifications and changes known to persons skilled in the art according to the spirit of the present invention are considered within the scope of the present invention as defined in the appended claims. For example, the recesses could be arranged between the two adjacent through holes in a diagonal direction rather than the lengthwise or transverse direction.

What is claimed is:

1. An electrical connector for electrically connecting an electronic package to a circuit substrate, the electrical connector comprising:
    a base having a plurality of conductive terminals received therein; and
    a cover movably engaged on the base and defining a plurality of through holes, each through hole comprising a large upper portion adjoin a top surface of the cover and a small lower portion adjoin a bottom surface of the cover;
    wherein a plurality of recesses is defined in the cover between adjacent small lower portions of the through holes such that a span of the cover between adjacent through holes is substantially the same from the top surface to the bottom surface.

2. The electrical connector as claimed in claim 1, wherein the large upper portion of the through hole is a guiding opening for facilitating insertion of a corresponding pin of the electronic package into the through hole.

3. The electrical connector as claimed in claim 1, wherein the small lower portion of the through hole is a receiving portion for receiving a corresponding pin of the electronic package.

4. The electrical connector as claimed in claim 1, wherein each of the recesses has a generally circular cross-section.

5. The electrical connector as claimed in claim 1, wherein each of the recesses has a generally rhombic cross-section.

6. An electrical connector for electrically connecting an electronic package to a circuit substrate, the electrical connector comprising:
    a base having a plurality of conductive terminals received therein; and
    a cover movably engaged on the base and defining a plurality of through holes, each through hole comprising a large upper portion adjoin a top surface of the cover and a small lower portion adjoin a bottom surface of the cover;
    wherein a plurality of recesses is defined in the cover between adjacent small lower portions of the through holes such that any transverse expansion or contraction sustained by the cover is substantially uniform as between the top surface and the bottom surface.

7. The electrical connector as claimed in claim 6, wherein the large upper portion of the through hole is a guiding opening for facilitating insertion of a corresponding pin of the electronic package into the through hole.

8. The electrical connector as claimed in claim 6, wherein the small lower portion of the through hole is a receiving portion for receiving a corresponding pin of the electronic package.

9. The electrical connector as claimed in claim 6, wherein each of the recesses has a generally circular cross-section.

10. The electrical connector as claimed in claim 6, wherein each of the recesses has a generally rhombic cross-section.

11. An electrical connector for electrically connecting an electronic package to a circuit substrate, the electrical connector comprising:
    a base having a plurality of conductive terminals received therein; and
    a cover movably engaged on the base and defining a plurality of through holes through which a plurality of pins of said electronic package seated upon the cover are adapted to extend freely; wherein
    a plurality of recesses are defined in the cover among said through holes, and each of said recesses is located substantially equidistantly between the corresponding adjacent two through holes.

12. The connector as claimed in claim 11, wherein each of said through holes defines a large upper portion and a small lower portion.

13. The connector as claimed in claim 12, wherein cover defines opposite top and bottom surfaces, and said recesses extend upwardly from the bottom surface while not through the top surface.

14. The connector as claimed in claim 11, wherein two side plates downwardly extend from two opposite sides of the cover.

* * * * *